March 15, 1955 F. FEKETICS 2,704,301

SHIELDING ENCLOSURES

Filed Aug. 13, 1953 5 Sheets-Sheet 1

INVENTOR.
FRANK FEKETICS
BY Robert K. Youtie
ATTORNEY

INVENTOR.
FRANK FEKETICS
BY Robert K. Yautie
ATTORNEY

INVENTOR.
FRANK FEKETICS
BY Robert K. Youtie
ATTORNEY

March 15, 1955 F. FEKETICS 2,704,301

SHIELDING ENCLOSURES

Filed Aug. 13, 1953 5 Sheets-Sheet 4

INVENTOR.
FRANK FEKETICS
BY Robert K. Youtie
ATTORNEY

March 15, 1955

F. FEKETICS 2,704,301

SHIELDING ENCLOSURES

Filed Aug. 13, 1953

5 Sheets-Sheet 5

INVENTOR.
FRANK FEKETICS
BY *Robert K. Youtie*
ATTORNEY

United States Patent Office 2,704,301

Patented Mar. 15, 1955

2,704,301

SHIELDING ENCLOSURES

Frank Feketics, Riverside, N. J.

Application August 13, 1953, Serial No. 373,979

9 Claims. (Cl. 174—35)

This invention relates generally to shielding devices, and is particularly directed to enclosures for suppressing radiations in a particular area.

As is well known to those versed in the art, the characteristics of electronic equipment are adversely effected by the presence of undesired interference signals, such as those produced by atmospheric conditions or by electrical and electronic equipment in the vicinity. A shielded area free of such interference has been found necessary for research, testing and operation of many electrical and electronic devices. Hence, shielding enclosures and rooms have been devised to attenuate extraneous signals.

Heretofore, shielding enclosures were subject to numerous disadvantages; for example, the necessity of soldering adjacent wall panels to insure adequate conductivity therebetween. In addition to being a laborious and time consuming operation, the soldering seriously hindered dismantling of the enclosure and effected decreased attenuation with age. Further, the panels of prior shielding enclosures were not interchangeable which limited the speed of assembly and versatility of use. Another drawback of the prior devices was the inability to mount equipment on the walls of the enclosure without piercing the conductive or shielding material. Thus, a nail or other metallic fastener would frequently penetrate the shielding material and project out from the enclosure to effect undesirable antenna-like operation.

Accordingly, it is a principal object of the present invention to provide a simple and efficient means for shielding electronic equipment from interference signals over a major portion of the spectrum.

It is another object of the present invention to provide a shielding enclosure which is adapted to be quickly and easily assembled and disassembled, and in which the component parts are constructed so as to occupy a minimum of space in their disassembled or knocked down condition to effect economies in transportation and storage. A coordinate object resides in the provision of interchangeable panels which permit construction and dismantling without concern for the particular positioning of specific panels, so that such operations may be efficiently performed by unskilled labor.

It is still another object of the present invention to provide a shielding enclosure having the characteristics mentioned in the foregoing paragraph in which the panels are adapted for intimate electrical contact with each other without the need for solder or like material, and in which the assembling and disassembling operations require only the use of simple fasteners and common hand tools. An allied object of the present invention is to provide a shielding enclosure of the type described in which the panels are of modular construction so as to permit ready change in enclosure size and/or shape.

It is yet another object of the present invention to provide a shielding enclosure having highly improved means for mounting equipment within the enclosure. That is, by the present invention equipment may be mounted at any desired position on the top, bottom and side walls by the use of conventional metal fasteners, such as nails and screws, without piercing the shielding material or otherwise effecting the enclosure attenuation.

It is still a further object of the present invention to provide a shielding enclosure having a highly improved ingress and egress means, which means includes a door selectively adaptable for either right or left-hand operation, as desired. Further, the door panel is provided with novel latch means which permit the door panel to be positioned in a corner of the enclosure and which is selectively actuable by movements in opposite directions regardless of the right or left-hand operation of the door.

A still further object of the present invention is to provide a shielding enclosure of the type described which is simple in construction and durable in operation, which is effective for its intended purposes, and which can be manufactured and sold at a reasonable cost.

Other objects of the present invention will become apparent upon reading the following specification and referring to the accompanying drawings, which form a material part of this disclosure.

The invention accordingly consists in the features of construction, combinations of elements, and arrangements of parts, which will be exemplified in the construction hereinafter described and of which the scope will be indicated by the appended claims.

Figure 1:
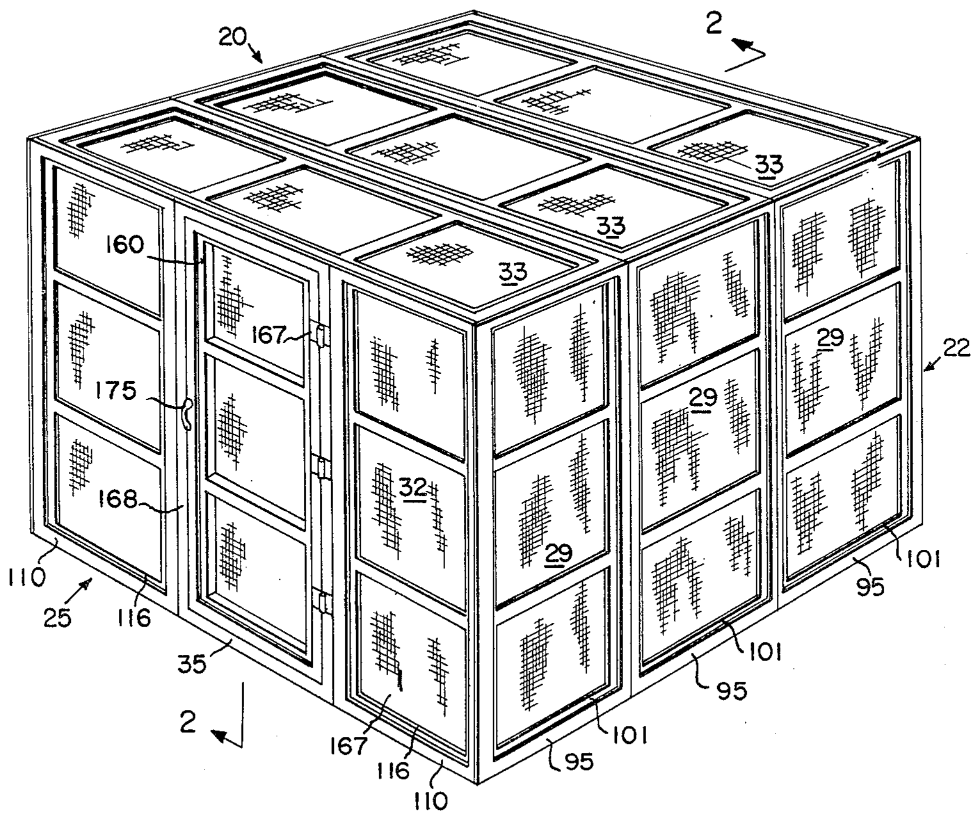
Figure 1 is a perspective view showing an enclosure constructed in accordance with the present invention, a door being illustrated as mounted for left-hand operation.
Figure 2:
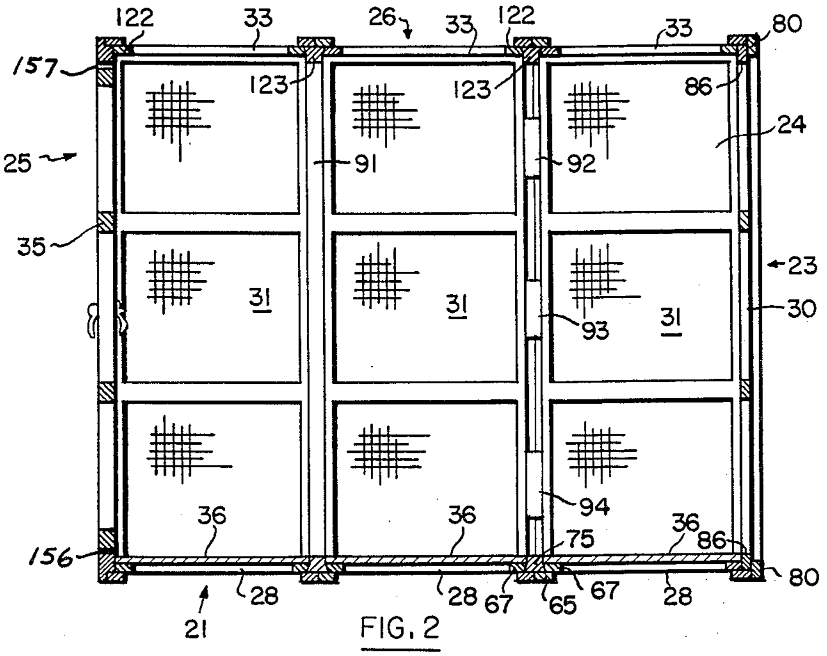
Fig. 2 is a sectional, elevational view taken substantially along the line 2—2 of Fig. 1.
Figure 3:
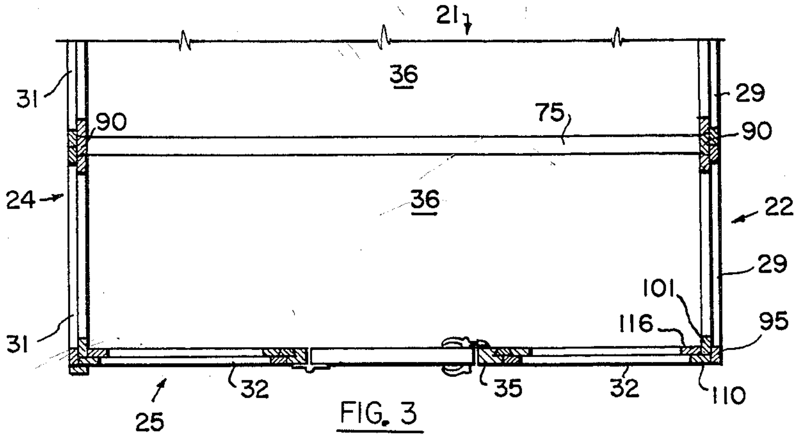
Fig. 3 is a partial, sectional plan view of the device of Fig. 1, the door being illustrated as reversed for right-hand operation.

Referring now more particularly to the drawings, and specifically to Figs. 1, 2 and 3 thereof, the embodiment of the invention illustrated therein comprises a generally rectangular shielding enclosure or room 20. The room includes a horizontally disposed bottom wall 21, upstanding side walls 22, 23, 24 and 25 extending along the side edges of the bottom wall, and a horizontally disposed top wall 26 spaced above the bottom wall and extending between the side walls. Each of the bottom, side and top walls is composed of at least one panel, which panels are substantially identical in construction, as will appear more fully hereinafter. For purposes of illustration, the walls are each shown as having three panels, the bottom wall panels being designated 28, the panels of the side walls 22, 23, 24 and 25 being designated, respectively, 29, 30, 31 and 32, and the top wall panels being designated 33. One of the side walls, such as 25, may be provided with a door panel 35; and the bottom wall 21 may include supporting members or floor boards 36, all of which will be described in greater detail hereinafter.

Figure 7:
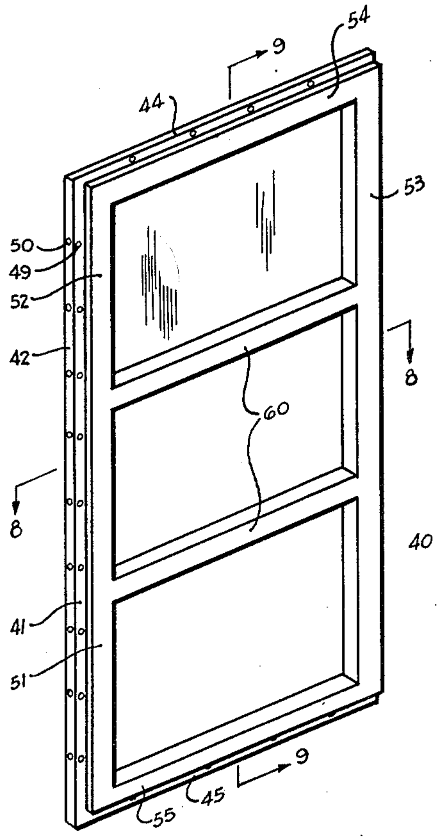
Fig. 7 is a perspective view showing a single panel constructed in accordance with the present invention.
Figure 8:
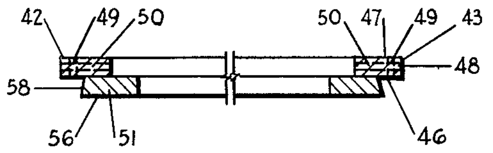
Fig. 8 is a sectional view taken substantially along the line 8—8 of Fig. 7.
Figure 9:
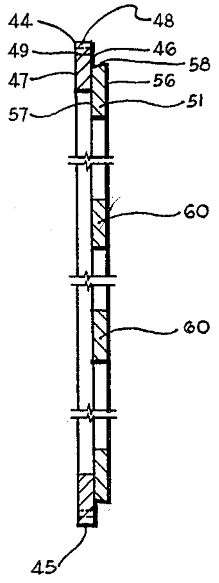
Fig. 9 is a sectional view taken substantially along the line 9—9 of Fig. 7.

In Figs. 7, 8 and 9 is clearly shown the construction of a wall panel 40 which is substantially identical to and interchangeable with any one of the aforementioned bottom, side and top wall panels. Thus, the following detailed description of the wall panel 40 will be applicable in all material respects to the panels of the bottom, side and top walls. The panel 40 comprises a substantially rectangular border or marginal frame 41 having the sides 42 and 43 and ends 44 and 45. The marginal frame is formed with oppositely facing parallel surfaces 46 and 47 and a peripheral or bounding edge 48 extending between and preferably at right angles to the oppositely facing surfaces. A plurality of transversely extending through bores 49 are formed in the marginal frame 41 in spaced relation along the bounding edge 48 and opening through the surfaces 46 and 47. Additional through bores 50 are formed in the side pieces 42 and 43 extending inwardly from the bounding edge 48 and each intersecting one of the bores 49. The bores 50 thus extend coplanar with the marginal frame 41, and the bores 49 perpendicular to the latter. The screening or other conductive sheet material necessarily employed in shielding enclosures has been omitted from Figs. 7, 8 and 9 for purposes of clarity of understanding. However, it will be understood that a sheet of conductive material, such as wire mesh or screening, is preferably arranged across the inner surface 46 of the frame 41 and is bent to overlie the bounding edge 48 along all sides of the panel. The conductive sheeting may be tacked, stapled, glued or otherwise suitably secured to the frame 41.

A second or inner frame 51, of generally rectangular configuration, is arranged in face to face relation with respect to the inner surface 46 of the frame 41 and is fixedly secured to the latter frame by any suitable means, copper plated nails or drive screws having been found advantageous. The inner frame includes side members 52 and 53 extending along the side members 42 and 43, and end members 54 and 55 extending along the end members 44 and 45. As is clearly shown in Figs. 8 and 9, the inner frame 51 is formed with oppositely facing inner and outer surfaces 56 and 57, which define therebetween a peripheral edge 58. The surface 57 of the frame 51 is fixedly secured, by any suitable means, in adjacent relation to the surface 46 of the frame 41, the frame 51 being slightly smaller than the frame 41 so that the peripheral edge 58 is spaced inwardly at all points from the bounding edge 48. That is, the sides and ends of the frame 51 are offset inwardly with respect to the sides and ends of the frame 41 so as to form step-like members on the latter. In the presently preferred form of the invention, the peripheral edge 58 of the inner frame 51 is under beveled or cut away, as seen in Figs. 8 and 9, to form an angle of approximately 85° with respect to the surface 56, for a purpose which will become apparent hereinafter. For added structural rigidity, one or more cross bars 60 may be secured between the side members 52 and 53, as desired. A sheet of wire mesh, screening or other conductive material (not shown) may be arranged across the surface 56 of the inner frame 51, bent to overlie the under beveled peripheral edge 58, the marginal frame surface 46, and the bounding edge 48 and secured in position by tacks, staples, glue or other suitable means. Such screening will combine with the hereinbefore described screening to provide a cellular shielding construction.

Figures 5, 6:
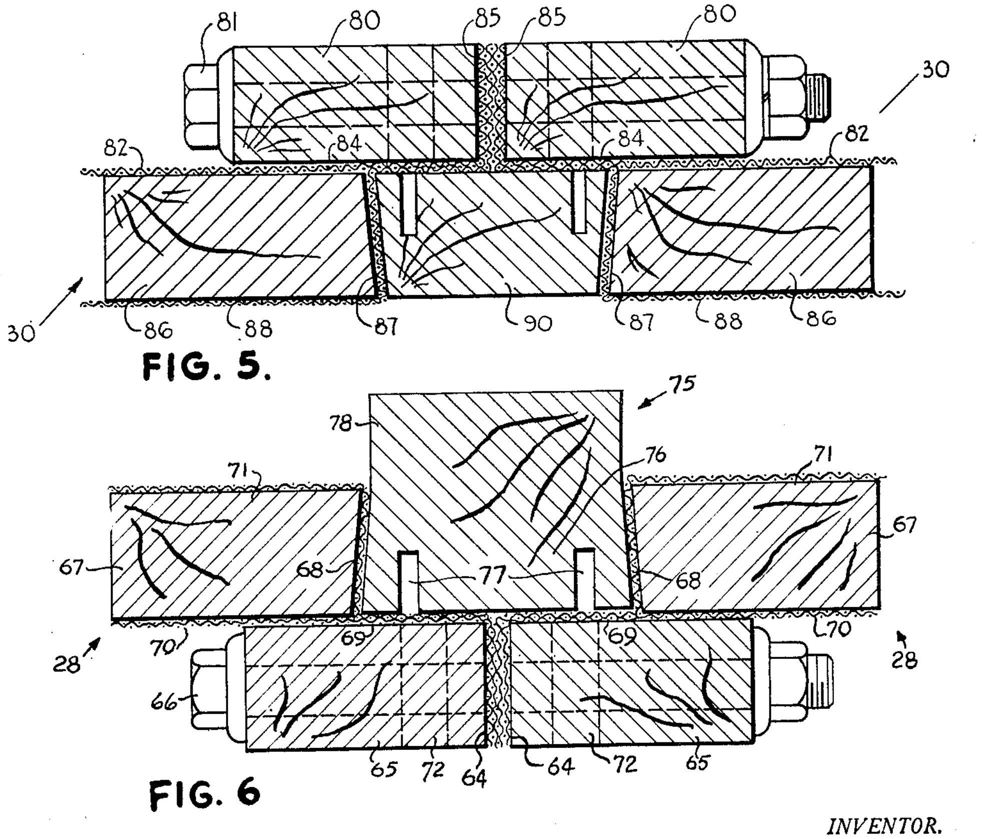
Fig. 5 is a fragmentary, sectional view, greatly enlarged, showing a side wall joint construction of the present invention.
Fig. 6 is a fragmentary, sectional view, greatly enlarged, showing a bottom wall joint construction of the present invention.

Having described in detail the structure of the panels employed to form the bottom, side and top walls, we will now consider their cooperating relationship in the construction of the enclosure. The bottom wall panels 28 are disposed horizontally and adapted to rest upon a suitable supporting surface (not shown). The outer or marginal frames 65 of the bottom wall panels 28 have their bounding edges in abutment with each other and are fixedly secured together by bolts 66, see Fig. 6. It will be seen that the inner frames 67 of the bottom wall panels 28 have their under beveled peripheral edges 68 spaced apart so as to combine with the inner surfaces 69 of the marginal frames 65 to form a substantially dovetail-shaped groove. Sheets of screening or other conductive material 70 are arranged across the inner surfaces 69 of the marginal frames 65 and bent over the bounding edges thereof. Additional sheets of screening 71 are secured over the inner surfaces of the inner frames 67, and bent to overlie the under beveled edges 68, the inner marginal frame surfaces 69 and the bounding edges 64, so that the sheets 70 and 71 of each panel are in intimate electrical contact with each other and provide a cellular shielding construction. Further, the sheets of adjacent panels are held in intimate electrical contact between the bounding edges of the marginal frames 65 by the bolts 66 when the latter secure the panels 28 in edge to edge aligned relation. It will be noted that the marginal frames 65 are provided with transversely extending through apertures 72, which function when the panel is disposed in a corner, as will appear more fully hereinafter.

Disposed in the dovetail shaped groove formed by the under beveled peripheral edges 68 is a strip 75 having a dovetail or V-shaped portion 76 which is conformably received in the groove and positively retained therein. The dovetail portion of the strip 75 is provided with longitudinally extending grooves 77 which are adapted to compensate for expansion and contraction and other variable conditions. The strip 75 is formed with a rectangular portion 78 which extends upwardly beyond the inner surfaces of the inner frames 67 a distance equal to the thickness of the floor boards 36. Thus, the floor boards 36 will rest upon the inner surfaces of the inner frames 67, or the screens 71 if such are provided, and will be flush with the upper surface of the strip 75.

The side wall panels are positioned along the edges of the bottom wall to form corner joints, which will be described more specifically hereinafter, and the panels of each side wall are arranged in edge to edge aligned relation as was described in connection with the bottom wall panels. For example, the panels 30 have their outer rectangular, marginal frames 80 arranged in edge to edge relation and are secured together by the bolts 81. A sheet of shielding material 82 is secured across the inner face 84 of each of the marginal frames 80 and is bent over the marginal frame bounding edge 85. In this manner, the conductive sheets 82 of adjacent side wall panels 30 are held in intimate electrical contact between the bounding edges 85 by the bolts 81. On the inner faces 84 of the marginal frames 80 are secured the inner frames 86 having undercut peripheral edges 87, which combine with each other and with the marginal frames 80 to provide a dovetail or V-shaped groove. A second sheet of conductive material 88 may be secured across the inner face of the inner frame 86 of each side wall panel, and bent to overlie the under beveled peripheral edge 87, the inner marginal frame face 84 and the bounding edge 85, as described hereinabove in connection with the bottom wall panels. A trapezoidal strip or mounting member 90 is adapted to conformably engage in the groove formed by the under beveled edges 87 and be positively retained therein. The mounting member 90 may extend the entire length of the adjacent panels or may be of any desired lesser length as illustrated at 91, 92, 93 and 94 in Fig. 2. It will now be understood that the mounting members 90, 91, 92, 93 and 94 are firmly held in position and adapted to receive fasteners, such as nails or screws, for mounting equipment at any desired position on the enclosure walls. Further, the mounting members will permit the use of such fasteners without the latter piercing or engaging the conductive sheet material or otherwise adversely effecting the enclosure attenuation.

Figure 4:
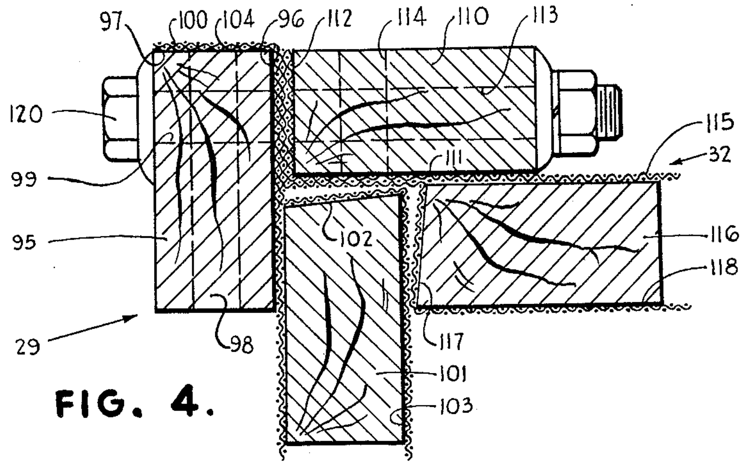
Fig. 4 is a fragmentary, sectional view, greatly enlarged, showing a corner joint construction of the present invention.

It will be noted that the panels of each wall are in edge to edge angular relation with respect to the panels of the adjacent walls, thus forming corner joints. As all of the corner joints of the enclosure are identical, it will suffice to describe only one, such as that of Fig. 4 showing panels 29 and 32. The panel 29 includes a marginal frame 95 having an inner surface 96 and a bounding edge 97. The marginal frame 95 is formed with edge to edge through bores 98 corresponding to the through bores 50 of Figs. 8 and 9, and transversely extending through bores 99 corresponding to the through bores 49 of Figs. 8 and 9. A sheet of screening or other suitable shielding material 100 is arranged across the inner face 96 and bounding edge 97 of the marginal frame 95, as described hereinbefore. The inner frame 101 is fixed to the marginal frame 95 with its undercut peripheral edge 102 and inner surface 103 offset inwardly, respectively, from the bounding edge 97 and inner surface 96 of the marginal frame 95 to provide a stepped panel border. A second sheet of screening or other suitable conductive material 104 is arranged over the inner face 103 of the inner frame 101 and bent to overlie the peripheral edge 102, the inner face 96, and the bounding edge 97.

The panel 32 includes an outer or marginal frame 110 having an inner surface 111 and a bounding edge 112. The marginal frame 110 is formed with a plurality of edge to edge through bores or openings 113 corresponding to bores or openings 50 in Figs. 8 and 9, and transverse through bores 114 corresponding to the bores 49 of the Figs. 8 and 9. A sheet of conductive material 115 is arranged across the inner surface 111 of the marginal frame 110 and bent to overlie the bounding edge 112. The inner frame 116 is fixed to the inner surface 111 of the marginal frame 110 and has its peripheral edge 117 and inner surface 118 offset inwardly, respectively, from the bounding edge 112 and inner marginal frame surface 111 to thereby provide a stepped border for the panel 32. As clearly shown in Fig. 4, the angularly disposed panels 29 and 32 have their stepped borders in interengaging relation with each other so as to provide a staunch and rigid joint. Stated otherwise, the stepped borders of the angularly disposed panels are arranged in interjacent relation, so that the bounding edge 112 is contiguous to the inner marginal frame face 96, the peripheral edge 117 is contiguous to the inner frame face 103, and the marginal frame face 111 is contiguous to the peripheral edge 102. It will now be understood that this interlocking corner joint structure serves to rigidify and reinforce the adjacent panels and may be quickly and easily assembled and disassembled. That is, it is only necessary to insert or remove the bolts 120 from the aligned bores 113 and 99. As all of the wall panels are preferably provided with the intersecting bores, they are equally well adapted for angular disposition or corner joint assembly. It will be further noted that the corner joint provides intimate electrical contact between the shielding screens between the bounding edge 112 and surface 96, the contact being maintained by the bolts 120. As seen in Fig. 2, the foregoing description relating to side wall corner joints is equally applicable to side and top wall corner joints and side and bottom wall corner joints.

The top wall panels 33 are arranged with their inner frames downwards and secured together in edge to edge aligned relation in exactly the same manner as described in connection with the bottom and side wall panels. In the grooves formed intermediate the inner frames 122 of the top wall panels, there may be positioned either trapezoidal mounting members as illustrated at 90 in Fig. 5, or a dovetailed mounting member 123, as desired. By this means, equipment may be mounted on or suspended from the top wall 26 at any desired position thereof by the use of conventional fasteners as described hereinbefore.

As it is contemplated to manufacture all of the wall panels in standard or modular sizes, and as all of the wall panels are identical in construction, it is apparent that the wall panels will be freely interchangeable. For example, any one of the wall panels 29 may be interchanged with any one of the wall panels 30, 31 or 32, and, of course, with another one of the wall panels 29. Further, it will now be understood that the enclosure 20 may be increased or decreased in size, as desired, by the addition or removal of panels. That is, the enclosure may be enlarged by adding an additional panel to each of the side walls 22 and 24 and to the bottom and top walls, and, conversely, the enclosure may be decreased in size by removing a panel from each of the side walls 22 and 24 and the top and bottom walls. As assembly and disassembly of the enclosure is effected entirely by means of nuts and bolts, and as the particular panels may be disposed in any desired wall, it will be understood that the enclosure or room may be completely assembled and disassembled by unskilled labor using only common hand tools.

Further, it will be seen that the floor boards 36 may also be of modular or standard size. This is accomplished by the use of the mounting members or strips 75 which project upwardly beyond the inner panel frame 67 adjacent to the peripheral edge 68 thereof, see Fig. 2. As the inner frames 86 and 116 of the side wall panels 30 and 32 project upwardly beyond the inner frames 67 of the adjacent bottom wall panels, it will be seen that the spaces between adjacent members 75, and the spaces between the inner frames 86 and 116 and the adjacent members 75 are equal, so that floor boards 36 of equal width will be conformably received therebetween. This is so for an enclosure of any modular size.

Figure 13:
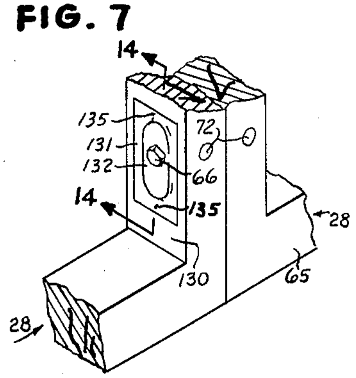
Fig. 13 is a fragmentary, perspective view showing means for fastening together the enclosure panels.
Figure 14:
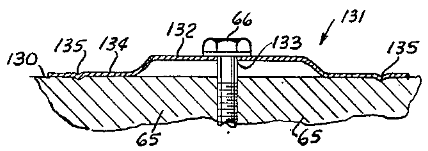
Fig. 14 is a sectional view taken substantially along the line 14—14 of Fig. 13.

A preferred means for detachably fastening together adjacent panels is shown in detail in Figs. 13 and 14. With a pair of panels 28, 28 in aligned relation, the bounding edges of the marginal frame 65 will be in abutting engagement and the bolts or other suitable tie means 66 may be inserted through the marginal frames so as to project outwardly beyond the oppositely facing edge surfaces 130. In face to face abutting engagement with each of the edge surfaces 130 is a pressure plate 131 having a raised, dome-like central portion 132. A through aperture 133 is formed in the raised central portion 132 for receiving the tie bolt 66. The marginal edge portion 132 of the pressure plate 131 is substantially flat for surface contact with the edge surface 130 of the marginal frame 65, and is formed with at least two, spaced indentations or dimples 135. It will be observed in Fig. 14 that the dimples 135 form projections on the underside of the pressure plate 131, which projections penetrate or pierce the surface 130 of the marginal frame 65 to prevent sliding movement of the pressure plate relative to the marginal frame. This is particularly desirable during assembly and disassembly of the enclosure to prevent rotation of the pressure plates into engagement with the shielding material.

The pressure plate 131 may be stamped of sheet material, and is preferably constructed so as to have a slight amount of inherent resilience. Thus, when the bolt 66 is tightened, the domed central portion 132 will resiliently abut the head of the bolt or other tie means to prevent or forestall loosening of the latter. Further, it will be noted that the pressure applied by the bolt or tie means will be distributed substantially evenly around the flat marginal edge of the pressure plate so as to maintain the panels 28 in firm and substantially complete edge to edge contact for maximum conductivity between panels. Of course, the above described fastening means may be employed to secure angularly disposed panels, as seen in Fig. 4.

Figure 10:
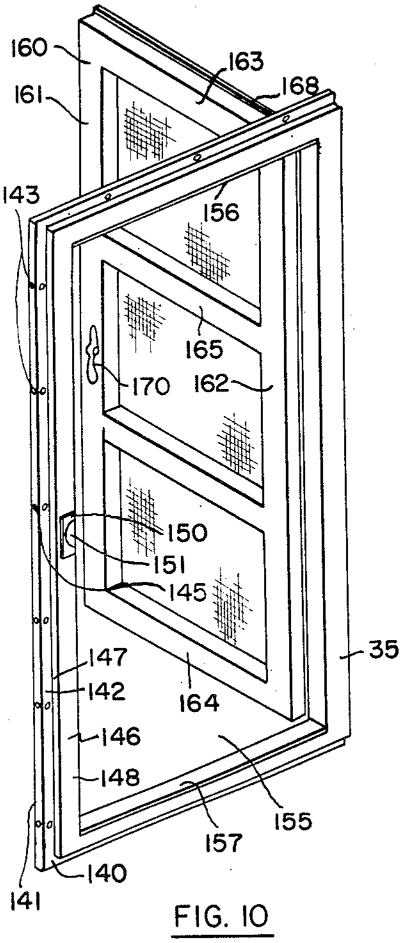
Fig. 10 is a perspective view showing a door panel and door constructed in accordance with the present invention.

In Fig. 10 is shown a more detailed view of the door panel 35 mentioned hereinbefore. The door panel is sufficiently similar in construction to be interchangeable with any of the previously described wall panels. More specifically, the door panel includes a marginal frame 140 having oppositely facing parallel surfaces, and a bounding edge 141 extending between the parallel faces. The marginal frame is further provided with a plurality of through bores or bolt holes 143 extending inwardly through the peripheral edge 141, and a plurality of transversely extending through bores or bolt holes 145, corresponding to the bolt holes 50 and 49, respectively. Fixed on the inner face of the marginal frame 140 is an inner frame 146 having a peripheral edge 147 and an inner face 148 offset inwardly, respectively, from the bounding edge 141 and inner face 142 of the marginal frame 140. Thus, the marginal frame 140 and the inner frame 146 combine to provide a panel having a stepped peripheral border in the same manner as the previously described panels. Further, the peripheral edge 147 of the inner frame 146 may be under beveled to form an acute angle with the inner surface 148 so that a dovetailed groove will be formed between the peripheral edges of the inner frames of the door panel 35 and the next adjacent panel.

Figure 12:
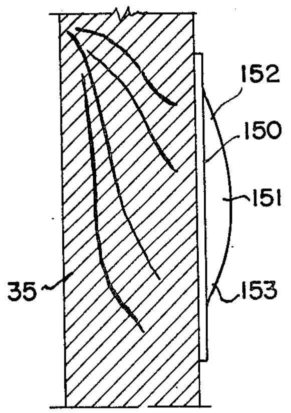
Fig. 12 is a sectional view taken substantially along the line 12—12 of Fig. 11.

For shielding purposes, it is preferred to completely enclose or encase the marginal and inner frames 141 and 146 with conductive sheet material, such as copper or the like. On the inner face 148 of the inner frame 146 is fixed at least one plate 150 which carries an arcuate wedge-like member 151. As best seen in Fig. 12, the wedge-like member 151 tapers or decreases in thickness toward its upper and lower ends 152 and 153, for a purpose appearing presently.

A substantially rectangular door opening 155 is provided centrally of the door panel 35, through which personnel and equipment may pass into and out of the enclosure or room 20. Along the upper and lower ends of the door opening 155 and fixed to the upper and lower end pieces of the panel 35 are thresholds or tread plates 156 and 157, which may be made of any suitable conductive material. Mounted in the door opening 155 for opening and closing movement with respect thereto is a door 160. The door includes side members 161 and 162, and top and bottom members 163 and 164, and rigidifying cross members 165. The side, top and bottom members are preferably covered or encased with conductive sheet material, such as copper or the like, and reticulated or other suitable conductive material may be extended across the door to provide effective shielding when the latter is in closed position. To further insure conductivity across the door seams, silver-plated phosphor-bronze fingers (not shown) may be arranged between the door 160 and the door panel 35.

Along one side 162 of the door 160, hinges 167 are secured to the door and door panel to mount the door for swinging movement into and out of the opening 155. On the outer face of the door, extending along the periphery thereof, is a rigid strip 168, which may be formed of brass or other suitable material, and which is adapted to abut the door panel when the door is in closed position, to thereby limit the swinging movement of the door in one direction to its closed position.

Adjacent to the inner face of the door 160 is arranged a latching member 170, which is mounted for rotative movement about a horizontal axis transverse of the door. A supporting shaft (not shown) carries the latching member 170 intermediate the ends of the latter and is rotatably mounted in the door 160. The latching member 170 has one end 171 adapted to frictionally engage the inclined or tapering surfaces of the wedge-like member 151 upon rotative movement of the latching member when the door is in closed position. The other end 172 of the latching member is shaped for manually gripping the same to effect rotative movement of the end 171 into and out of frictional engagement with the wedge-like member. The handle end 172 is further shaped to clear the wedge-like member and permit rotative movement of the handle over the wedge-like member, the handle being limited in length so as not to project beyond the peripheral edge 147 of the inner frame 146.

Figure 11:
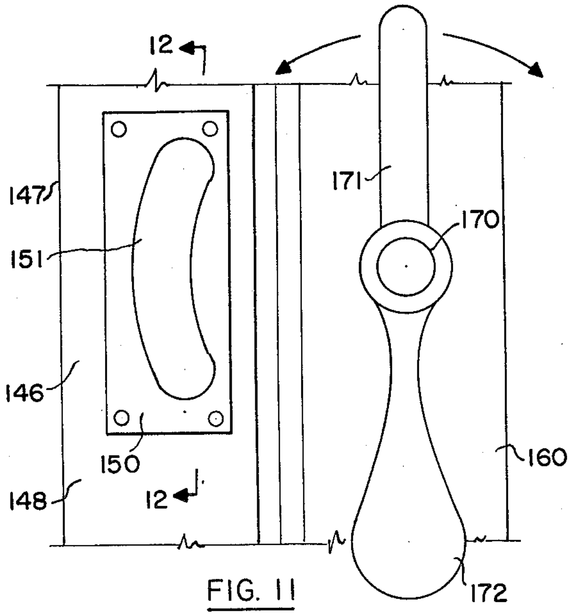
Fig. 11 is an enlarged, fragmentary elevational view showing a preferred door latch construction.

In operation, when the door 160 is closed, the strip 168 will abut the door panel 35 to limit the closing movement of the door, and the latch member 170 may be selectively rotated in either clockwise or counterclockwise direction, as seen in Fig. 11, until the end 171 of the latch member frictionally engages with the lower or upper inclined surface, respectively, of the wedge-like member 151. In this manner, the door 160 may be firmly latched in closed position, the strip 168 serving as stop means and the latch member 170 being frictionally held on the wedge-like member 151. As the handle 172 does not extend beyond the peripheral edge 147, it is apparent that the door panel and door may be positioned adjacent to an angularly disposed wall panel, as in a corner, and the latter panel will not interfere with the door operation. Preferably, an exterior door handle 175 is rigidly connected to the latch member 170, as seen in Fig. 1.

It will be noted from observation of Figs. 1 and 10, that the door 160 has been reversed from left to right-hand operation. As all of the panels are symmetrical in configuration, they may be reversed or inverted without effecting their interengaging relation. Upon inversion of the door panel 35, it will be seen that the door is changed from left to right-hand operation or vice versa. Thus, numerous problems of space, obstructions and like situations may be avoided by reversing the door operation. It is for this reason that the thresholds or tread plates 156 and 157 are placed at both ends of the door opening. Further, it will be noted that reversal of the door will not cause reversal of the latch member operation, as the latter may be operated in either clockwise or counterclockwise direction.

While it is preferred to fabricate the wall and door panels of wood, and copper screening, it is appreciated that other materials having the requisite characteristics may be substituted. Further, it has been found desirable to utilize copper plated nuts and bolts for securing the panels together.

From the foregoing, it is seen that the present invention provides a shielding enclosure which fully accomplishes its intended objects and which is well adapted to meet practical conditions of use.

Although the present invention has been described in some detail by way of illustration and example for purposes of clarity of understanding, it is understood that certain changes and modifications may be made within the spirit of the invention and the scope of the appended claims.

I claim:

1. An enclosure comprising a plurality of interchangeable panels, each of said panels comprising a substantially rectangular peripheral margin having inner and outer faces defining therebetween a peripherally extending bounding edge, a step-like member extending entirely about the inner face of said margin and spaced inwardly at all points from said bounding edge, said step like member thus providing a peripherally extending inwardly offset edge and an inwardly offset inner face, and a sheet of conductive material extending completely across said rectangular peripheral margin and secured in conforming engagement against said inner margin face and the entire extent of said bounding edge; at least one of said panels being disposed horizontally with its step-like member upwards to form a bottom wall, at least one of the remaining panels being disposed vertically along each side edge of said bottom wall to form side walls, each of said vertically disposed side wall panels having its inner margin face facing towards the bounding edge of said bottom wall panel and its inwardly offset edge facing towards the inner margin face of said bottom wall panel, at least some of said side wall panels being disposed in angular relation with respect to the next adjacent side wall panel to form side wall corners, one panel of each pair of angularly disposed panels having its bounding edge facing toward the inner margin face of the adjacent panel and its inwardly offset edge facing toward the offset inner face of said adjacent panel, and at least another one of said panels being disposed horizontally with its step-like member downwards to form a top wall, said top wall panel having its bounding edge facing toward the inner margin faces of said side wall panels and its inwardly offset edge facing toward the offset inner faces of said side wall panels; and a plurality of fasteners each extending transversely through the peripheral margins of a pair of adjacent panels to maintain the sheet portions intermediate adjacent panels in intimate surface contact, said panels thus serving to reinforce each other to provide a completely shielded enclosure of staunch construction.

2. In a shielding device, a plurality of substantially identical panels, each of said panels comprising a rectangular marginal frame having inner and outer faces defining therebetween a bounding edge, a sheet of conductive material extending completely across said marginal frame on the inner face thereof and covering the entire extent of said bounding edge, an inner frame of rectangular configuration similar to but smaller than said marginal frame disposed overlying said sheet and secured to the inner face of said marginal frame, said inner frame having an inner face and a peripheral edge spaced inwards, respectively, from the inner face and bounding edge of said marginal frame, a second sheet of conductive material extending across the inner face of said inner frame and covering said inwardly spaced edge, said inner marginal frame face and said bounding edge, a pair of said panels being selectively disposable in aligned abutting relation with their bounding edges confronting each other to form a wall, the sheet portions covering the confronting bounding edges being in intimate contact with each other and said inwardly spaced edges combining with the inner marginal frame faces to define a groove for receiving a mounting member when said pair of panels are in said aligned relation, said pair of panels being further disposable in angular relation with the bounding edge of one of said panels confronting the inner marginal frame face of the other of said panels to form a corner, the sheet portions covering the confronting bounding edge and inner marginal frame face being in intimate contact with each other and the inwardly spaced edge of said other panel extending interjacent the inner marginal frame face and inwardly spaced edge of said one panel to effect interlocking engagement of said pair of panels when in said angular relation, said panels thus being completely interchangeable to provide a radiation leak-proof junction in both of said aligned and angular dispositions, and fastener elements for securing said panels together in their aligned and angular dispositions.

3. The structure defined in claim 2, wherein each of said panels is formed with a plurality of spaced through bores extending inwards from said bounding edge coplanar with said marginal frame and a plurality of spaced bores extending perpendicular to said marginal frame and opening through the inner and outer faces of said marginal frame, the coplanar bores of an adjacent pair of panels being in registry with each other when said adjacent pair of panels are in said aligned relation for receiving said fastener elements, and the coplanar bores of one panel of said adjacent pair of panels being in registry with the perpendicular bores of the other panel of said pair of adjacent panels when the latter are disposed in angular relation for receiving said fastener elements.

4. A panel for a shielded enclosure, said panel comprising a rectangular marginal frame having inner and outer faces defining therebetween a bounding edge, said marginal frame being formed with a plurality of spaced through bores extending inwards from said bounding edge coplanar with said marginal frame and a plurality of spaced bores extending perpendicular to said marginal frame intersecting said coplanar bores and opening through the inner and outer faces of said marginal frame, a sheet of conductive material extending completely across said marginal frame on the inner face thereof substantially completely covering said bounding edge and apertured in registry with said coplanar and perpendicular bores, and an inner frame of rectangular configuration similar to but smaller than said marginal frame disposed overlying said sheet and secured to the inner face of said marginal frame, said inner frame having an inner face and peripheral edge spaced inwards, at all points respectively, from the inner face and bounding edge of said marginal frame, said panel being selectively disposable with any portion of its bounding edge confronting the bounding edge of a like panel and its coplanar bores in registry with the coplanar bores of said like panel to form a wall of said shielded enclosure, the registering bores of said pair of panels being adapted to receive fasteners for holding said panels in their wall forming relation, said first mentioned panel being further disposable with any portion of its inner marginal frame face confronting the bounding edge of a like panel and its perpendicular bores in registry with the coplanar bores of said like panel to form a corner of said shielded enclosure, the registering bores of said corner forming panels being adapted to receive fasteners for holding said panels in their corner forming relation.

5. The structure defined in claim 2, wherein said inwardly spaced edges are undercut so that said groove is substantially dovetail in section, to thereby positively retain mounting members in said groove.

6. A shielding enclosure comprising a plurality of interchangeable panels, each of said panels comprising a substantially rectangular marginal frame having inner and outer faces defining therebetween a bounding edge, a sheet of conductive material extending completely across said marginal frame and covering said bounding edge about the entire extent thereof, and an inner frame of rectangular configuration similar to but smaller than said marginal frame disposed overlying said sheet and secured to the inner face of said marginal frame, said inner frame having a peripheral edge and an inner face spaced inwardly at all points, respectively, from the bounding edge and inner face of said marginal frame, at least one of said panels being disposed horizontally with its inner frame upwards to form a bottom wall, at least one of the remaining panels being disposed vertically along each side edge of said bottom wall with their inner frames inwardly, each of said vertically disposed side wall panels having its inner marginal frame face contiguous to the bounding edge of said bottom wall panel and its peripheral edge contiguous to the inner marginal frame face of said bottom wall panel, the adjacent sheet portions of said side and bottom wall panels being in intimate contact with each other, at least some of said side wall panels being disposed in angular relation with respect to the next adjacent side wall panel to form side wall corners, one panel of each pair of angularly disposed panels having its inner marginal frame face contiguous to the bounding edge of the other panel and its peripheral edge contiguous to the inner marginal frame face of the other panel, the adjacent sheet portions of said angularly disposed pairs of panels being in intimate contact with each other, and at least another of said panels being disposed horizontally with its inner frame downwards to form a top wall, said top wall panel having its bounding edge contiguous to the inner marginal frame faces of said side wall panels and its peripheral edge contiguous to the inner faces of said inner frames of said side wall panels, the adjacent sheet portions of said side and top wall panels being in intimate contact with each other, and fastener means for securing adjacent panels together in their aligned and angular dispositions, whereby said panels reinforce each other to provide a staunch enclosure and the conductive sheet of each panel is in intimate surface contact with the sheets of the next adjacent panels to effect maximum attenuation at the panel junctions in both of said aligned and angular dispositions.

7. In an enclosure, a plurality of panels each having a stepped peripheral border, a conductive sheet covering each of said panels conformably overlying and secured against said stepped peripheral border, a pair of said panels being selectively disposable in edge to edge aligned relation with their adjacent sheet portions in intimate surface contact to form a shielding wall, the stepped border portions adjacent to said edges combining to form a groove for receiving a mounting member when said panels are in said aligned relation, said pair of panels being further disposable in angular relation with their adjacent sheet portions in intimate surface contact to form a shielding corner, said stepped borders being in interlocking engagement with each other to reinforce said panels when the latter are in said angular relation, and fastener means extendable through the adjacent border portions of adjacent panels for holding the latter in said aligned and angular relations.

8. The structure defined in claim 7, said fastener means comprising pressure plates in abutting engagement with non-contiguous oppositely facing surfaces of said panels, penetrating means on each of said plates engageable in said non-contiguous surfaces for preventing sliding movement of the latter with respect to said surfaces, and tie means extending through said panels and plates for securing the former together and holding the latter in said abutting engagement said pressure plate thus serving to distribute the holding force of said tie means to effect a maximum area of intimate contact between adjacent cover sheet portions.

9. The structure defined in claim 8, said penetrating means comprising spaced projections on one face of each of said pressure plates and adapted to pierce the surface of the associated panel.

References Cited in the file of this patent

UNITED STATES PATENTS

| | | |
|---|---|---|
| 1,704,560 | Doering | Mar. 5, 1929 |
| 2,120,861 | Hastings | June 14, 1938 |
| 2,329,041 | Ford | Sept. 7, 1943 |
| 2,405,987 | Arnold | Aug. 20, 1946 |
| 2,594,971 | Moulin | Apr. 29, 1952 |
| 2,599,944 | Salisbury | June 10, 1952 |

OTHER REFERENCES

Publication I, ARRL Report No. 5–48. "Specification and Design Characteristics for ARRL Screen-Room Model 1A and 1B." Published by U. S. Naval Air Development Center at Johnsville, Pa., August 11, 1947.

Publication II, NRL Report 3908. "Measuring the Shielding Efficiency of Screened Enclosures." Published by Naval Research Laboratory, Washington, D. C., November 14, 1951.